(12) United States Patent
Saito

(10) Patent No.: US 9,954,027 B2
(45) Date of Patent: Apr. 24, 2018

(54) IMAGE PICKUP DEVICE AND MANUFACTURING METHOD FOR IMAGE PICKUP DEVICE BY STACKING/BONDING OF CRYSTALLINE SILICON SUBSTRATES

(71) Applicant: OLYMPUS CORPORATION, Hachioji-shi, Tokyo (JP)

(72) Inventor: Haruhisa Saito, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/352,927

(22) Filed: Nov. 16, 2016

(65) Prior Publication Data
US 2017/0062506 A1 Mar. 2, 2017

Related U.S. Application Data

(63) Continuation of application No. PCT/JP2015/061992, filed on Apr. 20, 2015.

(30) Foreign Application Priority Data

Jun. 20, 2014 (JP) .................. 2014-127439

(51) Int. Cl.
*H01L 27/146* (2006.01)
*H01L 25/00* (2006.01)
(Continued)

(52) U.S. Cl.
CPC ...... *H01L 27/14643* (2013.01); *H01L 21/308* (2013.01); *H01L 21/30604* (2013.01);
(Continued)

(58) Field of Classification Search
None
See application file for complete search history.

(56) References Cited

U.S. PATENT DOCUMENTS

| 4,878,957 A | 11/1989 | Yamaguchi et al. |
| 2004/0113185 A1 | 6/2004 | Shibayama et al. |

(Continued)

FOREIGN PATENT DOCUMENTS

| JP | 1-315159 A | 12/1989 |
| JP | 7-297377 A | 11/1995 |

(Continued)

OTHER PUBLICATIONS

International Search Report dated Jun. 16, 2015, issued in counterpart International Application No. PCT/JP2015/061992 with English Translation (4 pages).

(Continued)

*Primary Examiner* — Ermias Woldegeorgis
(74) *Attorney, Agent, or Firm* — Westerman, Hattori, Daniels & Adrian, LLP

(57) ABSTRACT

A semiconductor device having a stacked structure formed by stacking a thinned first silicon substrate and a second silicon substrate supporting the first silicon substrate, wherein the first silicon substrate includes a first surface with a crystal surface orientation of (100) or (110) and a second surface opposite to the first surface, the second silicon substrate includes a third surface and a fourth surface that is opposite to the third surface and from which a silicon surface with a crystal surface orientation (111) is exposed, and wherein the semiconductor device is formed by etching silicon with a predetermined thickness in a direction from the first surface toward the second surface to make the first silicon substrate to be thinned, after bonding the first silicon substrate and the second silicon substrate in a state where the second surface and the third surface facing the second surface are bonded with each other.

5 Claims, 4 Drawing Sheets

(51) Int. Cl.
  *H01L 25/16* (2006.01)
  *H01L 25/065* (2006.01)
  *H01L 21/308* (2006.01)
  *H01L 27/14* (2006.01)
  *H01L 21/306* (2006.01)

(52) U.S. Cl.
  CPC ........ *H01L 25/065* (2013.01); *H01L 25/0657* (2013.01); *H01L 25/162* (2013.01); *H01L 25/167* (2013.01); *H01L 25/50* (2013.01); *H01L 27/14* (2013.01); *H01L 27/146* (2013.01); *H01L 27/1464* (2013.01); *H01L 27/1469* (2013.01); *H01L 27/14634* (2013.01); *H01L 27/14636* (2013.01)

(56) References Cited

U.S. PATENT DOCUMENTS

2012/0056288 A1* 3/2012 Yoshihara ......... H01L 23/49805 257/431
2012/0105696 A1* 5/2012 Maeda ............. H01L 21/76898 348/302
2012/0217600 A1 8/2012 Hongo et al.
2012/0248580 A1* 10/2012 Matsugai ................ H01L 22/12 257/621

FOREIGN PATENT DOCUMENTS

| JP | 2005-53066 A | 3/2005 |
| JP | 2012-084610 A | 4/2012 |
| JP | 2012-175049 A | 9/2012 |
| JP | 2013-62382 A | 4/2013 |
| WO | 2004/047178 A1 | 6/2004 |
| WO | 2012-132760 A1 | 10/2012 |
| WO | 2013-087707 A1 | 6/2013 |

OTHER PUBLICATIONS

Office Action dated Sep. 12, 2017, issued in counterpart Japanese Application No. JP 2014-127436 with Partial English Translation.

* cited by examiner

IMAGE PICKUP DEVICE AND MANUFACTURING METHOD FOR IMAGE PICKUP DEVICE BY STACKING/BONDING OF CRYSTALLINE SILICON SUBSTRATES

This application is a continuation application based on a PCT International Application No. PCT/JP2015/061992, filed on Apr. 20, 2015, whose priority is claimed on Japanese Patent Application No. 2014-127439, filed on Jun. 20, 2014. The contents of both the PCT International Application and the Japanese Patent Application are incorporated herein by reference.

BACKGROUND OF THE INVENTION

Field of the Invention

The present invention relates to a semiconductor device and a semiconductor device manufacturing method.

Description of Related Art

A semiconductor device having a stacked structure formed by stacking a plurality of semiconductor substrates (silicon substrates) is known. In such a semiconductor device, silicon of one surface of the stacked silicon substrates is etched to decrease a thickness thereof. An example of the semiconductor device having such a structure is a backside illumination (BSI) solid-state imaging device.

In the BSI solid-state imaging device, light is incident on a surface (a back surface) opposite to a surface (a front surface) on which circuit elements such as photoelectric conversion units converting incident light in a photoelectric conversion manner are formed. Accordingly, in the BSI solid-state imaging device, a lot of light is made to be incident on the photoelectric conversion units formed on the front surface of the silicon substrate by etching extra silicon on the back surface of the silicon substrate to make silicon substrate to be thinned.

However, when the silicon substrate is simply thinned, the thinned silicon substrate is wound in a roll shape or cracked. Accordingly, in a semiconductor device which is thinned by etching silicon on one surface of stacked silicon substrates such as the BSI solid-state imaging device, a configuration in which a silicon substrate to be thinned is held (supported) by another silicon substrate is employed.

For example, in the BSI solid-state imaging device, by stacking a silicon substrate (hereinafter referred to as a "second silicon substrate") other than a silicon substrate (hereinafter referred to as a "first silicon substrate") in which circuit elements such as photoelectric conversion units are formed, the first silicon substrate to be thinned is held (supported) by the second silicon substrate. At this time, in the BSI solid-state imaging device, only the first silicon substrate is thinned by stacking the second silicon substrate on a front surface of the first silicon substrate, and then etching extra silicon on the back surface of the first silicon substrate.

In recent semiconductor manufacturing processes, several etching methods for removing extra silicon of one silicon substrate in a semiconductor device having a configuration in which a plurality of silicon substrates are stacked and thinning the silicon substrate have been put into practice. A wet etching method has been widely used as the etching method of removing extra silicon of one silicon substrate in a semiconductor device having a configuration in which a plurality of silicon substrates are stacked and thinning the silicon substrate.

The wet etching method is a method of etching silicon using an alkaline etching solution capable of performing anisotropic etching, such as a nitrohydrofluoric acid solution, a potassium hydroxide (chemical formula: KOH) solution, or a tetramethylammonium hydroxide (TMAH) solution, as described in Japanese Unexamined Patent Application, First Publication No. 2013-062382. In the wet etching method, silicon is etched by immersing wafer substrates, in which a plurality of semiconductor devices to be thinned are formed, in an alkaline etching solution in the stacked state. Accordingly, overall silicon exposed from the stacked wafer substrates is etched. Therefore, in the wet etching method, silicon which should not be removed by etching, for example, a second silicon substrate holding (supporting) a first silicon substrate to be thinned in the above-mentioned BSI solid-state imaging device, needs to be protected so as not to be exposed to the etching solution. As a method of protecting silicon which should not be removed by etching, a method of forming an oxide film by heat treatment or the like as a protective film for protecting the silicon substrate or the like is used. This is because the alkaline etching solution exhibits high selectivity to an oxide film, that is, does not etch the oxide film, and thus silicon on a side having the oxide film formed thereon is not etched even when the oxide film is exposed to the etching solution.

As the first silicon substrate to be thinned, a wafer substrate having a silicon-on-insulator (SOI) structure in which a device layer and a silicon support substrate layer are bonded by a buried oxide (BOX) layer to form a single wafer substrate is used. That is, the first silicon substrate includes three layers of a device layer, a BOX layer, and a silicon support substrate layer before being thinned. In a wafer substrate having an SOI structure, transistors, wires, and the like, which are circuit elements of a semiconductor device, are formed on the device layer side and the silicon support substrate layer serves as extra silicon to be removed by etching. For example, in the above-mentioned BSI solid-state imaging device, circuit elements such as photoelectric conversion units are formed in the device layer, and the silicon support substrate layer is removed by etching. Accordingly, when etching is performed using the wet etching method, the silicon support substrate layer is etched by stacking the second silicon substrate on a surface of the device layer side of the first silicon substrate and then immersing the stacked body in an alkaline etching solution. At this time, the circuit elements of the semiconductor device (for example, photoelectric conversion units in the BSI solid-state imaging device) formed in the device layer are protected by a BOX layer as an oxide film similar to the method of protecting silicon which should not be removed by the above-mentioned oxide film. In this way, by using the wafer substrate having the SOI structure as the first silicon substrate to be thinned, only the silicon support substrate layer of the wafer substrated of the SOI structure can be etched using the wet etching method.

In the wet etching method, an oxide film is formed as a protective film for protecting silicon which should not be removed by etching. The oxide film is formed using the wet etching method before etching is performed in semiconductor manufacturing processes, that is, in processes of manufacturing a wafer substrate in which a plurality of semiconductor devices are formed. Accordingly, in an etching process using a general wet etching method, the oxide film is not substantially etched by an alkaline etching solution exhibiting high selectivity to the oxide film, that is, having a high selection ratio to the oxide film.

However, in the second silicon substrate stacked on the first silicon substrate, an uneven state of the oxide film which is formed before the etching process occurs at a place at which a silicon composition has a defect or a place including a foreign substance. That is, a defect is generated in the oxide film formed on the second silicon substrate. Accordingly, at a place at which a defect is unintentionally generated in the oxide film, the selection ratio may decrease and the etching speed (etching rate) by an etching solution may increase in comparison with a place at which no defect is generated in the oxide film.

In the process of manufacturing a wafer substrate using the semiconductor manufacturing processes, a scratch may be formed on the surface of the oxide film formed on the second silicon substrate. At a place at which the oxide film is scratched, the etching rate may also increase in comparison with a place at which the oxide film is not scratched.

SUMMARY OF THE INVENTION

According to a first aspect of the present invention, a semiconductor device having a stacked structure formed by stacking a first silicon substrate that is thinned and a second silicon substrate that supports the first silicon substrate, wherein the first silicon substrate includes a first surface with a crystal surface orientation of (100) or (110) and a second surface opposite to the first surface, wherein the second silicon substrate includes a third surface and a fourth surface that is opposite to the third surface and from which a silicon surface with a crystal surface orientation (111) is exposed, and wherein the semiconductor device is formed by etching silicon with a predetermined thickness in a direction from the first surface toward the second surface to make the first silicon substrate to be thinned, after bonding the first silicon substrate and the second silicon substrate in a state where the second surface and the third surface facing the second surface are bonded with each other.

According to a second aspect of the present invention, the semiconductor device according to the first aspect may further include a pixel unit in which a plurality of pixels are arranged in a two-dimensional matrix, wherein the plurality of pixels are formed at the second surface side of the first silicon substrate, and each of the plurality of pixels has a photoelectric conversion unit that generates a charge signal corresponding to an incident light.

According to a third aspect of the present invention, the semiconductor device according to the second aspect may further include a processing circuit that is formed at the third surface side of the second silicon substrate and includes circuit elements used for performing predetermined processes to pixel signals based on the charge signals generated by the photoelectric conversion units of the pixels in the pixel unit.

According to a fourth aspect of the present invention, the semiconductor device according to the third aspect may further include connection portions that are formed at the second surface side of the first silicon substrate and the third surface side of the second silicon substrate, wherein the connection portions are formed to connect circuit elements in the pixel unit and the corresponding circuit elements in the processing circuit.

According to a fifth aspect of the present invention, in the semiconductor device according to any one of the first to fourth aspects, an adhesive layer may be formed between the second surface of the first silicon substrate and the third surface of the second silicon substrate being opposite to the second surface, and the adhesive layer may be formed to bond the second surface of the first silicon substrate and the third surface of the second silicon substrate.

According to a sixth aspect of the present invention, a method of manufacturing a semiconductor device having a stacked structure formed by stacking a first silicon substrate which is thinned and a second silicon substrate that supports the first silicon substrate are stacked includes: a first step of bonding the first silicon substrate, which has a first surface with a crystal surface orientation of (100) or (110) and a second surface opposite to the first surface, and the second silicon substrate, which has a third surface and a fourth surface which is opposite to the third surface and in which a silicon surface with a crystal surface orientation (111) is exposed, to each other in a state in which the second surface faces the third surface; and a second step of immersing the first silicon substrate and the second silicon substrate in an etching solution in a state in which the first silicon substrate and the second silicon substrate are bonded to each other during the first step so as to expose the first surface and the fourth surface to the etching solution.

According to a seventh aspect of the present invention, the method of manufacturing a semiconductor device according to the sixth aspect may further include a third step of forming an oxide film on at least the fourth surface of the second silicon substrate at least before the second step.

According to an eighth aspect of the present invention, in the method of manufacturing a semiconductor device according to the sixth or seventh aspect, the etching solution may be a tetramethylammonium hydroxide solution.

According to a ninth aspect of the present invention, the method of manufacturing a semiconductor device according to any one of the sixth to eighth aspects may further include a fourth step of forming a pixel unit in which a plurality of pixels each having a photoelectric conversion unit generating a charge signal corresponding to an incident light are arranged in a two-dimensional matrix at the second surface side of the first silicon substrate before the first step.

According to a tenth aspect of the present invention, the method of manufacturing a semiconductor device according to the ninth aspect may further include a fifth step of forming a processing circuit that includes circuit elements for performing predetermined processes to pixel signals based on the charge signals generated by the photoelectric conversion units of the pixels in the pixel unit at the third surface side of the second silicon substrate before the first step.

According to an eleventh aspect of the present invention, the method of manufacturing a semiconductor device according to the tenth aspect may further include a sixth step of forming connection portions that are formed to connect the circuit elements in the pixel unit and corresponding circuit elements in the processing circuit at the second surface side of the first silicon substrate and the third surface side of the second silicon substrate after the fourth step and the fifth step and before the first step.

DETAILED DESCRIPTION OF THE INVENTION

First Embodiment

Figure 1:
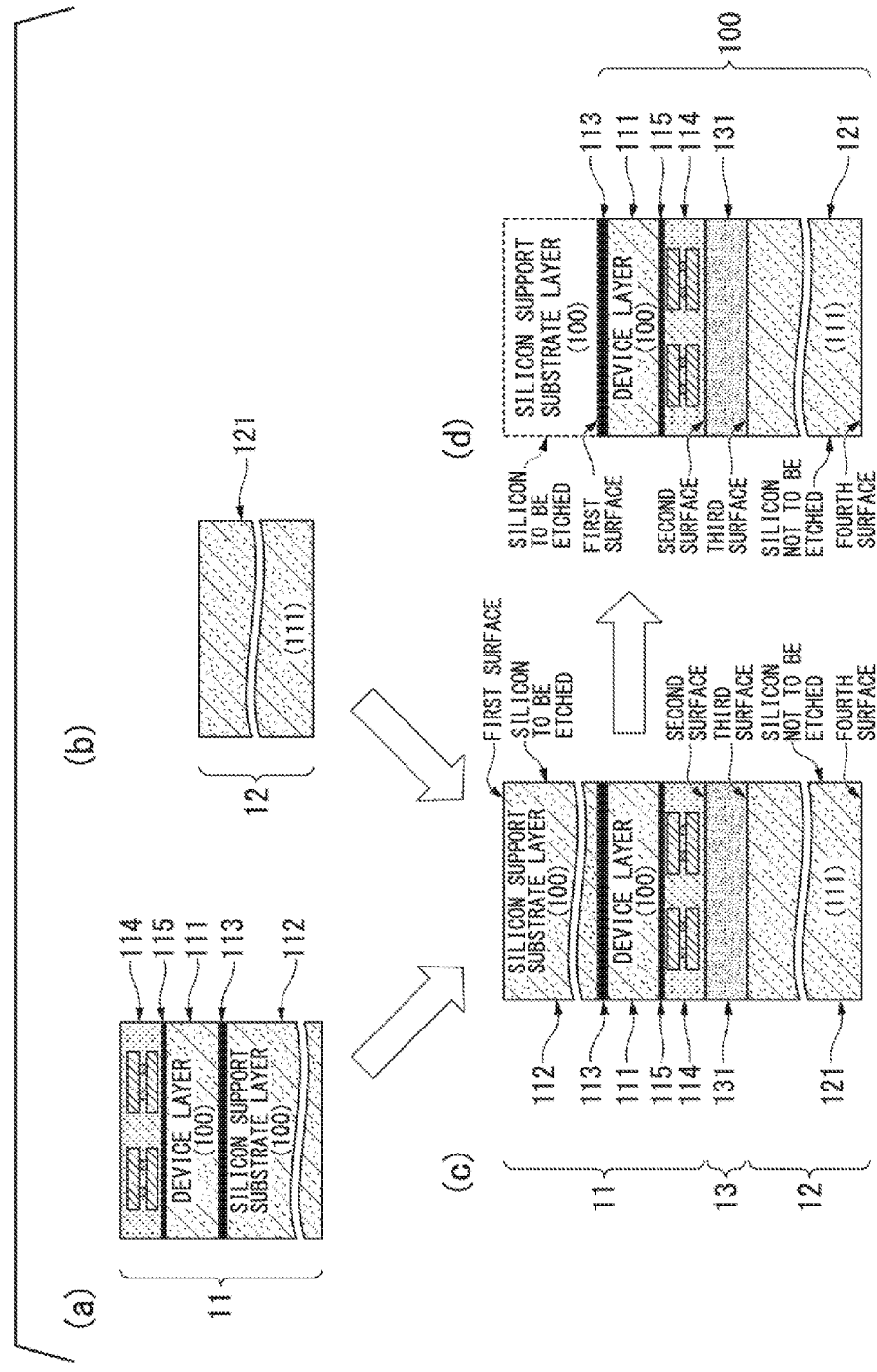
FIG. 1 is a cross-sectional view schematically showing a structure of a semiconductor device according to a first embodiment of the present invention.

Hereinafter, embodiments of the present invention will be described with reference to the accompanying drawings. FIG. 1 is a cross-sectional view schematically showing a structure of a semiconductor device according to a first embodiment of the present invention. A semiconductor device 100 according to the first embodiment has a configuration in which two silicon substrates (a first silicon substrate 11 and a second silicon substrate 12) are stacked. A plurality of semiconductor devices 100 according to the first embodiment are formed in a wafer substrate, but one semiconductor device 100 is assumed to be manufactured for the purpose of easing explanation of FIG. 1.

(a) of FIG. 1 shows a structure of the first silicon substrate 11, (b) of FIG. 1 shows a structure of the second silicon substrate 12, (c) of FIG. 1 shows a state in which the first silicon substrate 11 and the second silicon substrate 12 are stacked, and (d) of FIG. 1 shows a final structure of the semiconductor device 100. In FIG. 1, a method of manufacturing the semiconductor device 100 (a manufacturing process) is schematically shown in (a) to (d) of FIG. 1.

The first silicon substrate 11 is a silicon substrate in which circuit elements for realizing functions (operations) of the semiconductor device 100 are formed. As shown in (a) of FIG. 1, the first silicon substrate 11 is formed in a wafer substrate having a silicon-on-insulator (SOI) structure in which silicon layers of a device layer 111 and a silicon support substrate layer 112 are bonded by a buried oxide (BOX) layer 113 (hereinafter referred to as a "BOX layer 113") to construct a single wafer substrate. Here, the silicon layers in the first silicon substrate 11, that is, the device layer 111 and the silicon support substrate layer 112, have a crystal surface orientation of (100). The silicon substrate having a crystal surface orientation of (100) is a silicon substrate which is widely used in conventional semiconductor devices.

On the device layer 111 side of the first silicon substrate 11, transistors or wires including diffusion layers or single-layered or multiple-layered wires are formed as circuit elements for realizing functions (operations) of the semiconductor device 100. (a) of FIG. 1 schematically shows wires having a multi-layered structure in a wiring layer 114 formed on the first silicon substrate 11 to form the transistors. In the structure of the first silicon substrate 11 shown in (a) of FIG. 1, an oxide film 115 which is appropriately formed by heat treatment or the like when forming the wiring layer 114 also appears. In (a) of FIG. 1, a diffusion layer which is formed in the device layer 111 to form the transistors is not shown.

The second silicon substrate 12 is a single-crystal silicon substrate that holds (supports) the first silicon substrate 11 when the first silicon substrate 11 is thinned by etching. As shown in (b) of FIG. 1, the second silicon substrate 12 is formed in a wafer substrate including a single-layered silicon layer 121. Here, the silicon layer 121 of the second silicon substrate 12 has a crystal surface orientation of (111). The crystal surface orientation of (111) is a crystal surface orientation different from the crystal surface orientation of (100) of a silicon substrate which is widely used in conventional semiconductor devices.

In the semiconductor device 100, the first silicon substrate 11 and the second silicon substrate 12 are stacked. At this time, in the semiconductor device 100, as shown in (c) of FIG. 1, the silicon support substrate layer 112 side of the first silicon substrate 11 is defined as a first surface, and the device layer side in which circuit elements are formed in the first silicon substrate 11 is defined as a second surface. One surface of the second silicon substrate 12 is defined as a third surface and the other surface of the second silicon substrate 12 is defined as a fourth surface. The second surface of the first silicon substrate 11 and the third surface of the second silicon substrate 12 are facing to each other, and the first silicon substrate 11 and the second silicon substrate 12 are bonded to each other by an adhesive layer 13. The adhesive layer 13 is an adhesive for bonding the first silicon substrate 11 and the second silicon substrate 12 to each other and is formed of for example, a resin layer 131 such as a resin adhesive.

By immersing the first silicon substrate 11 and the second silicon substrate 12 in an etching solution in a stacked (bonded) state, silicon with a predetermined thickness of the first silicon substrate 11 is etched. More specifically, the semiconductor device 100 having the final structure is manufactured by etching the silicon support substrate layer 112 of the first silicon substrate 11.

That is, as shown in (d) of FIG. 1, the first silicon substrate 11 stacked with the second silicon substrate 12 is thinned using a wet etching method, and the semiconductor device 100 having the final structure in which the first surface is formed as a surface 1A is manufactured.

More specifically, by immersing wafer substrates in which the first silicon substrate 11 and the second silicon substrate 12 are formed in the etching solution in the stacked (bonded) state, the silicon support substrate layer 112 of the wafer substrate in which the first silicon substrate 11 is formed is etched.

Thereafter, by dividing (dicing) the stacked wafer substrates after being etched into semiconductor devices 100, the semiconductor device 100 having the final structure is manufactured.

At this time, an alkaline etching solution capable of performing anisotropic etching such as a tetramethylammonium hydroxide (TMAH) solution (hereinafter referred to as a "TMAH solution") is used as the etching solution which is used in the wet etching method. In the following description, it is assumed that the TMAH solution is used as the etching solution used in the wet etching method.

Here, the reason why the silicon support substrate layer 112 of the first silicon substrate 11 can be etched by the TMAH solution will be described below. As described above, the crystal surface orientation of the silicon support substrate layer 112 of the first silicon substrate 11 is (100) and the crystal surface orientation of the second silicon substrate 12 is (111). That is, as shown in (c) of FIG. 1, in the state in which the silicon substrates are stacked (bonded), the crystal surface orientation of the first surface is (100) and the crystal surface orientation of the fourth surface is (111), that is, the crystal surface orientations of the surfaces are different from each other. The TMAH solution is an etching solution capable of performing anisotropic etching. For example, a speed (an etching rate) at which etching progresses in the crystal surface orientations with the TMAH solution is (100):(111)=20:1, which exhibits a great difference in the etching rate.

Accordingly, when etching is performed using the TMAH solution, the silicon support substrate layer 112 of the first silicon substrate 11 having the crystal surface orientation of (100) is etched, for example, 20 times more than the second silicon substrate 12 having the crystal surface orientation of (111). That is, even when the second silicon substrate 12 of the fourth surface is exposed to the TMAH solution, the silicon support substrate layer 112 of the first surface is etched more than the second silicon substrate 12, and the second silicon substrate 12 is not substantially etched with the progress of etching. Accordingly, when the silicon substrates shown in (c) of FIG. 1 are immersed in the TMAH solution in the stacked (bonded) state, the silicon support substrate layer 112 is sequentially etched from the first surface to the second surface.

Even when the etching using the TMAH solution progresses and the entire silicon support substrate layer 112 is etched, the circuit elements formed on the device layer 111 side on the first silicon substrate 11 are protected by the BOX layer 113. This is because the selection ratio of the TMAH solution to an oxide film is, for example, silicon: oxide film=8000:1, which exhibits a great difference in selectivity. Due to the high selectivity of the TMAH solution to the oxide film, the progress of etching is the same state as if the etching stopped at the BOX layer 113. Accordingly, as shown in (d) of FIG. 1, it is possible to manufacture the semiconductor device 100 having a structure in which the silicon support substrate layer 112 in the first silicon substrate 11 is etched.

According to the first embodiment, a semiconductor device (the semiconductor device 100) having a structure in which a first silicon substrate (the first silicon substrate 11) that is thinned and a second silicon substrate (the second silicon substrate 12) that supports the first silicon substrate are stacked is provided. The semiconductor device 100 is manufactured so that the first silicon substrate 11 is thinned by bonding the first silicon substrate 11, which has a first surface with a crystal surface orientation of (100) or (110) and a second surface opposite to the first surface, and the second silicon substrate 12, which has a third surface and a fourth surface with a crystal surface orientation (111) opposite to the third surface, to each other in a state in which the second surface and the third surface are facing to each other, and then etching silicon (the silicon support substrate layer 112 of the first silicon substrate 11) with a predetermined thickness from the first surface to the second surface.

According to the first embodiment, the semiconductor device 100 in which an adhesive layer (the adhesive layer 13) that bonds the second surface of the first silicon substrate 11 and the third surface of the second silicon substrate 12 is formed between the second surface of the first silicon substrate 11 and the third surface of the second silicon substrate 12 facing the second surface is constructed.

According to the first embodiment, a method of manufacturing a semiconductor device 100 having a structure in which the first silicon substrate 11 which is thinned and the second silicon substrate 12 that supports the first silicon substrate are stacked is provided. The method of manufacturing the semiconductor device 100 includes: a first step of bonding the first silicon substrate 11 having a first surface with a crystal surface orientation of (100) or (110) and a second surface opposite to the first surface and the second silicon substrate 12 having a third surface and a fourth surface with a crystal surface orientation (111) opposite to the third surface to each other in a state in which the second surface and the third surface are facing to each other; and a second step of immersing the first silicon substrate 11 and the second silicon substrate 12 in an etching solution (the alkaline etching solution: the TMAH solution) in a state in which the first silicon substrate 11 and the second silicon substrate 12 are bonded to each other in the first step so as to expose the first surface and the fourth surface to the TMAH solution.

According to the first embodiment, the method of manufacturing the semiconductor device 100 in which the etching solution is tetramethylammonium hydroxide (TMAH) solution (the alkaline etching solution: the TMAH solution) is constructed.

As described above, in the semiconductor device 100 according to the first embodiment, the crystal surface orientation of the silicon support substrate layer 112 to be removed by etching in the first silicon substrate 11 and the crystal surface orientation of the second silicon substrate 12 which should not be removed by etching are set to be different from each other.

After the first silicon substrate 11 and the second silicon substrate 12 are stacked, silicon with a predetermined thickness of the first silicon substrate 11 is wet-etched using an alkaline etching solution capable of performing anisotropic etching. Accordingly, in the semiconductor device 100 according to the first embodiment, a silicon layer of a desired surface, that is, the silicon support substrate layer 112 to be removed, can be etched using the wet etching method.

In the semiconductor device 100 according to the first embodiment, as shown in FIG. 1 (particularly, (b) of FIG. 1), an oxide film for protecting the second silicon substrate 12 is not formed. That is, in the semiconductor device 100 according to the first embodiment, an oxide film which is formed on a surface which should not be removed by etching (a surface to be protected) when etching one surface of a silicon substrate in a conventional semiconductor device using the wet etching method is not formed. Accordingly, in the semiconductor device 100 according to the first embodiment, it is possible to skip a step of forming an oxide film which is required before an etching process in manufacturing a conventional semiconductor device. That is, in the semiconductor device 100 according to the first embodiment, it is possible to reduce at least one of steps of manufacturing the semiconductor device 100. Accordingly, in the semiconductor device 100 according to the first embodiment, it is possible to reduce the cost to manufacturing the semiconductor device 100. If an oxide film is not formed on the second silicon substrate 12, it is not necessary to consider a defect or a scratch on a surface of a formed oxide film which has been considered in manufacturing a conventional semiconductor device.

In the semiconductor device 100 according to the first embodiment, since an oxide film is not formed on the second silicon substrate 12, the second silicon substrate 12 is also slightly etched by the TMAH solution. The quantity (a thickness) of the second silicon substrate 12 which is etched does not have a large influence on the semiconductor device 100. However, a configuration in which the second silicon substrate 12 is not additionally etched by the TMAH solution by forming an oxide film on the second silicon substrate 12 may be employed.

Second Embodiment

Figure 2:
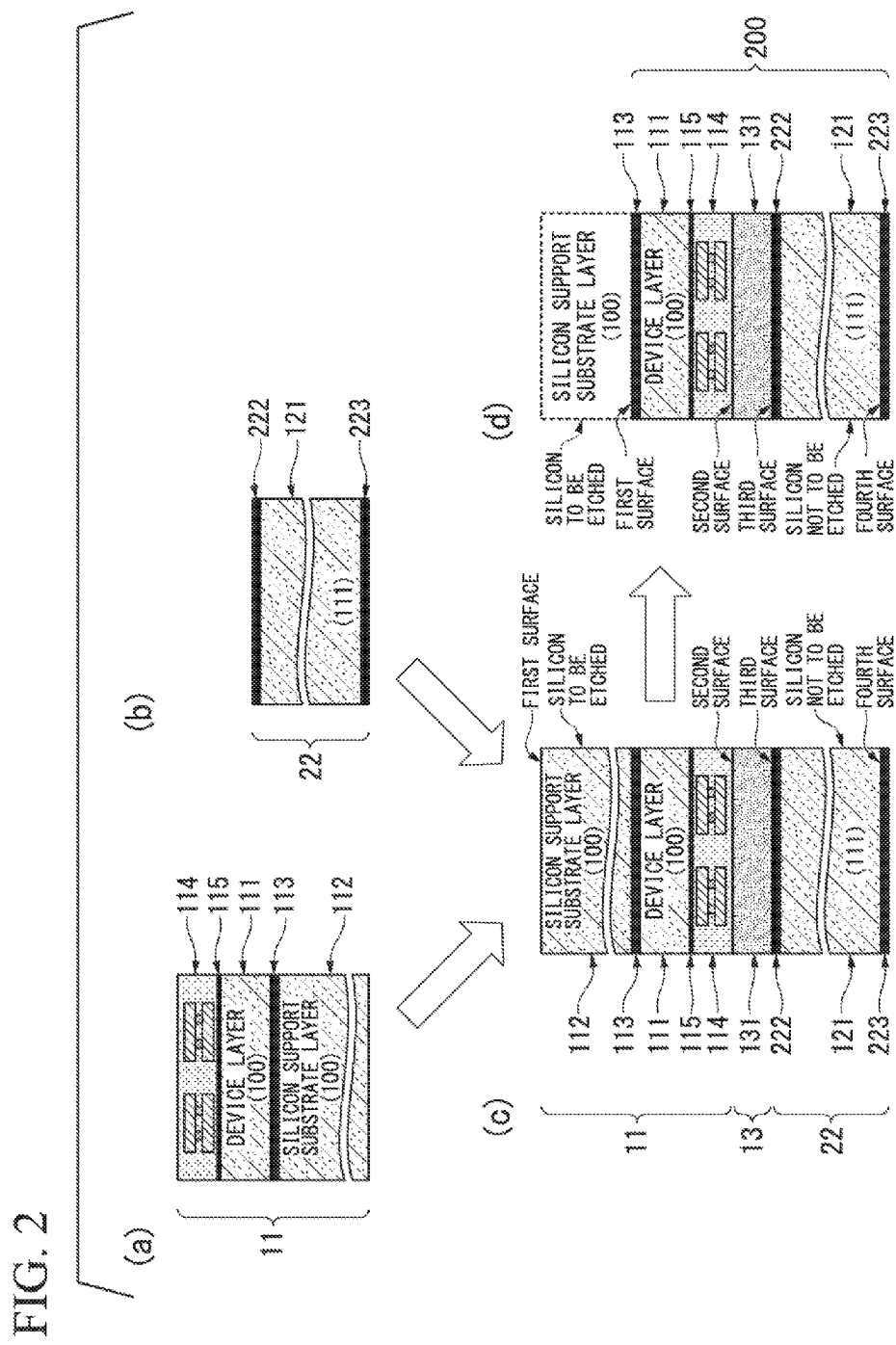
FIG. 2 is a cross-sectional view schematically showing a structure of a semiconductor device according to a second embodiment of the present invention.

A semiconductor device according to a second embodiment will be described below. The semiconductor device according to the second embodiment has a configuration in which even a little bit of etching of the second silicon substrate is also suppressed using a high selection ratio of a TMAH solution, which is used in a wet etching method, to an oxide film by forming an oxide film on the second silicon substrate. FIG. 2 is a cross-sectional view schematically showing a structure of the semiconductor device according to the second embodiment. Similarly to the semiconductor device 100 according to the first embodiment shown in FIG. 1, a semiconductor device 200 according to the second embodiment has a configuration in which two silicon substrates (a first silicon substrate 11 and a second silicon substrate 22) are stacked. Similarly to the semiconductor device 100 according to the first embodiment, a plurality of semiconductor devices 200 according to the second embodiment are formed in a wafer substrate, but one semiconductor device 200 is assumed to be manufactured for the purpose of easing explanation of FIG. 2.

A configuration of the semiconductor device 200 according to the second embodiment is the same as the configuration of the semiconductor device 100 according to the first embodiment except that an oxide film is formed on the second silicon substrate 22. Accordingly, in the following description, the same elements in the semiconductor device 200 according to the second embodiment as the elements of the semiconductor device 100 according to the first embodiment will be referenced and described by the same reference numerals as in the semiconductor device 100 according to the first embodiment, and detailed descriptions of the same elements as in the semiconductor device 100 according to the first embodiment will not be repeated.

(a) of FIG. 2 shows a structure of the first silicon substrate 11, (b) of FIG. 2 shows a structure of the second silicon substrate 22, (c) of FIG. 2 shows a state in which the first silicon substrate 11 and the second silicon substrate 22 are stacked, and (d) of FIG. 2 shows a final structure of the semiconductor device 200. Similarly to FIG. 1, FIG. 2 schematically shows a method of manufacturing the semiconductor device 200 (a manufacturing process) in (a) to (d) of FIG. 2.

The first silicon substrate 11 shown in (a) of FIG. 2 is the same as in the semiconductor device 100 according to the first embodiment, and thus a detailed description thereof will not be repeated.

Similarly to the second silicon substrate 12 of the semiconductor device 100 according to the first embodiment, the second silicon substrate 22 is a single-crystal silicon substrate that holds (supports) the first silicon substrate 11 when the first silicon substrate 11 is thinned by etching. As shown in (b) of FIG. 2, the second silicon substrate 22 is formed in a wafer substrate including the same single-crystal silicon layer 121 as in the second silicon substrate 12 of the semiconductor device 100 according to the first embodiment. Here, the silicon layer 121 of the second silicon substrate 22 has a crystal surface orientation of (111).

An oxide film (an oxide film 222 and an oxide film 223) is formed on both surfaces of the second silicon substrate 22 by heat treatment or the like. Accordingly, even when the second silicon substrate 22 is etched by the wet etching method, the silicon layer 121 is protected by the oxide film 222 and the oxide film 223 so as not to be exposed to the TMAH solution.

In the semiconductor device 200, similarly to the semiconductor device 100 according to the first embodiment, the first silicon substrate 11 and the second silicon substrate 22 are stacked. At this time, in the semiconductor device 200, as shown in (c) of FIG. 2, the silicon support substrate layer 112 side of the first silicon substrate 11 is defined as a first surface, and a device layer side on which circuit elements are formed in the first silicon substrate 11 is defined as a second surface. A surface on which the oxide film 222 is formed in the second silicon substrate 22 is defined as a third surface and a surface on which the oxide film 223 is formed is defined as a fourth surface. Similarly to the semiconductor device 100 according to the first embodiment, the second surface of the first silicon substrate 11 and the third surface of the second silicon substrate 22 are made to are facing each other and the first silicon substrate 11 and the second silicon substrate 22 are bonded to each other by an adhesive layer 13. The adhesive layer 13 is the same as in the semiconductor device 100 according to the first embodiment, and thus a detailed description thereof will not be repeated.

Similarly to the semiconductor device 100 according to the first embodiment, by immersing the first silicon substrate 11 and the second silicon substrate 12 in the TMAH solution in a stacked (bonded) state, silicon with a predetermined thickness of the first silicon substrate 11 is etched. Accordingly, as shown in (d) of FIG. 2, the semiconductor device 200 having the final structure in which the silicon support substrate layer 112 is etched to make first silicon substrate 11 to be thinned and the first surface is formed as a surface 1A is manufactured.

At this time, in the semiconductor device 200, similarly to the semiconductor device 100 according to the first embodiment, the second silicon substrate 22, particularly, the fourth surface side exposed to the TMAH solution, is protected by the oxide film 223 in addition to having the configuration in which the crystal surface orientation of the silicon support substrate layer 112 of the first silicon substrate 11 and the crystal surface orientation of the second silicon substrate 22 are different from each other. This is because the selection ratio of the TMAH solution to the oxide film has a very large difference in selectivity such as silicon:oxide film=8000:1. Due to the high selection ratio to the oxide film, in the semiconductor device 200, the fourth surface side is not etched by the TMAH solution but the silicon support substrate layer 112 is sequentially etched from the first surface to the second surface in a state in which the silicon substrates shown in (c) of FIG. 2 are stacked.

Accordingly, as shown in (d) of FIG. 2, the semiconductor device 200 having a structure in which the silicon support substrate layer 112 of the first silicon substrate 11 is etched can be manufactured.

According to the second embodiment, a method of manufacturing a semiconductor device (the semiconductor device 200) including a third step of forming an oxide film (the oxide film 223) on at least a fourth surface of a second silicon substrate (the second silicon substrate 22) at least before a second step is configured.

As described above, in the semiconductor device 200 according to the second embodiment, similarly to the semiconductor device 100 according to the first embodiment, the crystal surface orientation of the silicon support substrate layer 112 to be removed by etching in the first silicon substrate 11 and the crystal surface orientation of the second silicon substrate 22 which should not be removed by etching are set to be different from each other. In the semiconductor device 200 according to the second embodiment, an oxide film for protecting the second silicon substrate 22 which should not be removed by etching is formed. Similarly to the semiconductor device 100 according to the first embodiment, after the first silicon substrate 11 and the second silicon substrate 22 are stacked, silicon with a predetermined thickness of the first silicon substrate 11 is wet-etched using the alkaline etching solution capable of performing anisotropic etching. Accordingly, in the semiconductor device 200 according to the second embodiment, only a silicon layer of a desired surface, that is, the silicon support substrate layer 112 to be removed, can be etched using the wet etching method.

In the semiconductor device 200 according to the second embodiment, a step of forming an oxide film cannot be skipped unlike the semiconductor device 100 according to the first embodiment, that is, the number of steps of manufacturing the semiconductor device 200 is the same as that in manufacturing a conventional semiconductor device. However, in the semiconductor device 200 according to the second embodiment, the fourth surface side exposed to the TMAH solution in the second silicon substrate 22 is protected by the oxide film 223 in addition to having a configuration in which crystal surface orientations of the silicon substrates are different from each other which is the same as in the semiconductor device 100 according to the first embodiment. Accordingly, in the semiconductor device 200 according to the second embodiment, even when a defect or a scratch is generated in the surface of the oxide film 223 as a protective film, a possibility that the second silicon substrate 22 holding (supporting) the thinned first silicon substrate 11 will be etched can be set lower than that in the conventional semiconductor device.

In the semiconductor device 200 according to the second embodiment, the oxide film (the oxide film 222 and the oxide film 223) is formed on both surfaces of the second silicon substrate 22. A wiring layer 114 of the first silicon substrate 11 is formed of an oxide film except for multi-layered wires formed in the wiring layer 114. Accordingly in the semiconductor device 200 according to the second embodiment, a configuration in which the adhesive layer 13 is not formed and the oxide film on the second surface of the first silicon substrate 11 and the oxide film on the third surface of the second silicon substrate 22 are directly bonded to each other by oxide film bonding may be employed. That is, in the semiconductor device 200 according to the second embodiment, the oxide film of the wiring layer 114 in the first silicon substrate 11 and the oxide film 223 of the second silicon substrate 22 may be directly bonded to each other.

In the semiconductor device 200 according to the second embodiment, the first silicon substrate 11 and the second silicon substrate 22 are stacked after the oxide film is formed on the second silicon substrate 22. However, the only surface of the semiconductor device 200 which should be protected by the oxide film 223 is the fourth surface. That is, in the second silicon substrate 22, the oxide film 223 has to be formed on only one surface as the fourth surface of the semiconductor device 200. Accordingly, the method of manufacturing the semiconductor device 200 according to the second embodiment is not limited to the method shown in FIG. 2. For example, as the method of manufacturing the semiconductor device 200 according to the second embodiment, a method of forming the oxide film 223 on only one surface corresponding to the fourth surface of the second silicon substrate 22 and stacking the first silicon substrate and the second silicon substrate in a state in which the other surface corresponding to the third surface of the second silicon substrate 22 on which the oxide film 223 is not formed and the second surface of the first silicon substrate 11 are facing each other may be employed. For example, as the method of manufacturing the semiconductor device 200 according to the second embodiment, a method of forming the oxide film 223 on only the fourth surface side of the semiconductor device 200 after stacking the first silicon substrate 11 and the second silicon substrate 22 may be employed.

Third Embodiment

Figure 3:
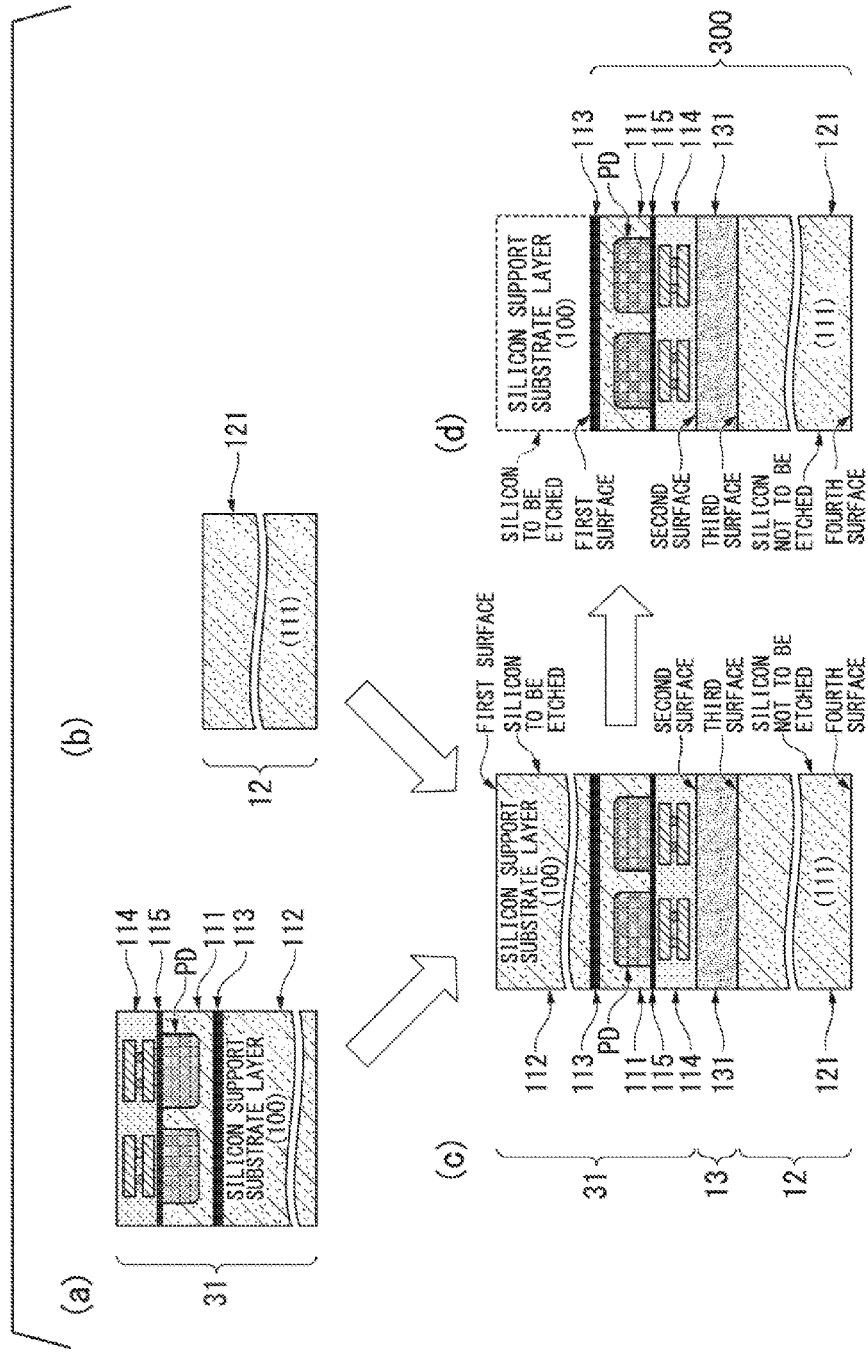
FIG. 3 is a cross-sectional view schematically showing a structure of a semiconductor device according to a third embodiment of the present invention.

A semiconductor device according to a third embodiment will be described below. The semiconductor device according to the third embodiment has a configuration of a backside illumination solid-state imaging device in which a pixel unit in which a plurality of pixels each having a photoelectric conversion unit such as a photo diode generating a charge signal corresponding to incident light are arranged in a two-dimensional matrix is formed in a first silicon substrate. FIG. 3 is a cross-sectional view schematically showing a structure of the semiconductor device (the backside illumination solid-state imaging device) according to the third embodiment. Similarly to the semiconductor device according to the first embodiment shown in FIG. 1, a semiconductor device 300 (hereinafter referred to as a "solid-state imaging device 300") according to the third embodiment has a configuration in which two silicon substrates (a first silicon substrate 31 and a second silicon substrate 12) are stacked. Similarly to the semiconductor device 100 according to the first embodiment, a plurality of solid-state imaging devices 300 according to the third embodiment are formed in a wafer substrate, but one solid-state imaging device 300 is assumed to be manufactured for the purpose of easing explanation of FIG. 3.

The configuration of the solid-state imaging device 300 according to the third embodiment is the same as the configuration of the semiconductor device 100 according to the first embodiment except that photoelectric conversion units such as photo diodes are formed in the first silicon substrate 31. Accordingly, in the following description, the same elements in the solid-state imaging device 300 according to the third embodiment as the elements of the semiconductor device 100 according to the first embodiment will be referenced and described by the same reference numerals as in the semiconductor device 100 according to the first embodiment, and detailed descriptions of the same elements as in the semiconductor device 100 according to the first embodiment will not be repeated.

(a) of FIG. 3 shows a structure of the first silicon substrate 31, (b) of FIG. 3 shows a structure of the second silicon substrate 12, (c) of FIG. 3 shows a state in which the first silicon substrate 31 and the second silicon substrate 12 are stacked, and (d) of FIG. 3 shows a final structure of the solid-state imaging device 300. Similarly to FIG. 1, FIG. 3 schematically shows a method of manufacturing the solid-state imaging device 300 (a manufacturing process) in (a) to (d) of FIG. 3.

The first silicon substrate 31 is a silicon substrate in which circuit elements for realizing functions (operations) of the solid-state imaging device 300 are formed. As shown in (a) of FIG. 3, the first silicon substrate 31 is formed in the same wafer substrate having an SOI structure like the first silicon substrate 11 in the first embodiment. Here, the silicon layers in the first silicon substrate 31, that is, a device layer 111 and the silicon support substrate layer 112 have a crystal surface orientation of (100), similarly to the first silicon substrate 11 in the first embodiment.

On the device layer 111 side on the first silicon substrate 31, photo diodes PD, transistors, or wires including diffusion layers or single-layered or multiple-layered wires are formed as the circuit elements for realizing functions (operations) of the solid-state imaging device 300. (a) of FIG. 3 schematically shows diffusion layers formed in the device layer 111 to form the photo diodes PD and multi-layered wires in the wiring layer 114 formed on the first silicon substrate 31 to form the photo diodes PD or the transistors. In the structure of the first silicon substrate 31 shown in (a) of FIG. 3, an oxide film 115 which is appropriately formed at the time of forming the wiring layer 114 also appears.

The second silicon substrate 12 shown in (b) of FIG. 3 is the same as in the semiconductor device 100 according to the first embodiment and thus detailed description thereof will not be repeated. The crystal surface orientation of the silicon layer 121 of the second silicon substrate 12 is (111).

In the solid-state imaging device 300, similarly to the semiconductor device 100 according to the first embodiment, the first silicon substrate 31 and the second silicon substrate 12 are stacked. At this time, in the solid-state imaging device 300, as shown in (c) of FIG. 3, the silicon support substrate layer 112 side of the first silicon substrate 31 is defined as a first surface, and the device layer side on which circuit elements such as photo diodes PD are formed in the first silicon substrate 31 is defined as a second surface. Similarly to the second silicon substrate 12 in the first embodiment, one surface of the second silicon substrate 12 is defined as a third surface and the other surface thereof is defined as a fourth surface. Similarly to the semiconductor device 100 according to the first embodiment, the second surface of the first silicon substrate 31 and the third surface of the second silicon substrate 12 are made to face each other and the first silicon substrate 31 and the second silicon substrate 12 are bonded to each other by an adhesive layer 13. The adhesive layer 13 is the same as in the semiconductor device 100 according to the first embodiment and thus detailed description thereof will not be repeated.

Similarly to the semiconductor device 100 according to the first embodiment, by immersing the first silicon substrate 31 and the second silicon substrate 12 in the TMAH solution in a stacked (bonded) state, silicon with a predetermined thickness of the first silicon substrate 31 is etched. Accordingly, as shown in (d) of FIG. 3, the solid-state imaging device 300 having the final structure in which the silicon support substrate layer 112 in the first silicon substrate 31 is thinned by the wet etching method and the first surface is a surface 1A is manufactured.

At this time, in the solid-state imaging device 300, similarly to the semiconductor device 100 according to the first embodiment, since the crystal surface orientation of the silicon support substrate layer 112 of the first silicon substrate 31 and the crystal surface orientation of the second silicon substrate 12 are different from each other, the silicon support substrate layer 112 of the first surface is more etched than the second silicon substrate 12 and the second silicon substrate 12 is not substantially etched even when the etching processes. Accordingly, in the state in which the silicon substrates are stacked as shown in (c) of FIG. 3, the silicon support substrate layer 112 is sequentially etched from the first surface to the second surface. Accordingly, as shown in (d) of FIG. 3, the solid-state imaging device 300 having a structure in which the silicon support substrate layer 112 in the first silicon substrate 31 is etched to the BOX layer 113 can be manufactured.

According to the third embodiment, the semiconductor device (the solid-state imaging device 300) including a pixel unit in which a plurality of pixels each having a photoelectric conversion unit (the photo diode PD) that is formed on the second surface side of the first silicon substrate (the first silicon substrate 31) and generates a charge signal corresponding to incident light are arranged in a two-dimensional matrix is configured.

According to the third embodiment, the method of manufacturing the solid-state imaging device 300 including a fourth step of forming a pixel unit in which a plurality of pixels each having a photoelectric conversion unit generating a charge signal corresponding to incident light are arranged in a two-dimensional matrix on the second surface side of the first silicon substrate 31 before the first step.

As described above, in the solid-state imaging device 300 according to the third embodiment, similarly to the semiconductor device 100 according to the first embodiment, the crystal surface orientation of the silicon support substrate layer 112 to be removed by etching in the first silicon substrate 31 and the crystal surface orientation of the second silicon substrate 12 which should not be removed by etching are set to be different from each other. Similarly to the semiconductor device 100 according to the first embodiment, after the first silicon substrate 31 and the second silicon substrate 12 are stacked, silicon with a predetermined thickness of the first silicon substrate 31 is wet-etched using the alkaline etching solution capable of performing anisotropic etching. Accordingly, in the solid-state imaging device 300 according to the third embodiment, only a silicon layer of a desired surface, that is, the silicon support substrate layer 112 to be removed, can be etched using the wet etching method. In the solid-state imaging device 300 according to the third embodiment, the same advantageous effects as in the semiconductor device 100 according to the first embodiment can be obtained.

The solid-state imaging device 300 according to the third embodiment shown in FIG. 3 has the same configuration as the semiconductor device 100 according to the first embodiment, but the method of manufacturing the solid-state imaging device 300 according to the third embodiment is not limited to the method shown in FIG. 3. That is, the solid-state imaging device 300 according to the third embodiment may have a configuration in which the second silicon substrate 12 holding (supporting) the first silicon substrate 31 is protected from etching by an oxide film, similarly to the semiconductor device 200 shown in FIG. 2.

In the solid-state imaging device 300 according to the third embodiment, the second silicon substrate 12 merely holds (supports) the first silicon substrate 31, but a configuration in which the functions (operations) of the solid-state imaging device 300 are realized by forming transistors or wires including diffusion layers or single-layered or multiple-layered wires in the second silicon substrate 12 may be employed.

Fourth Embodiment

Figure 4:
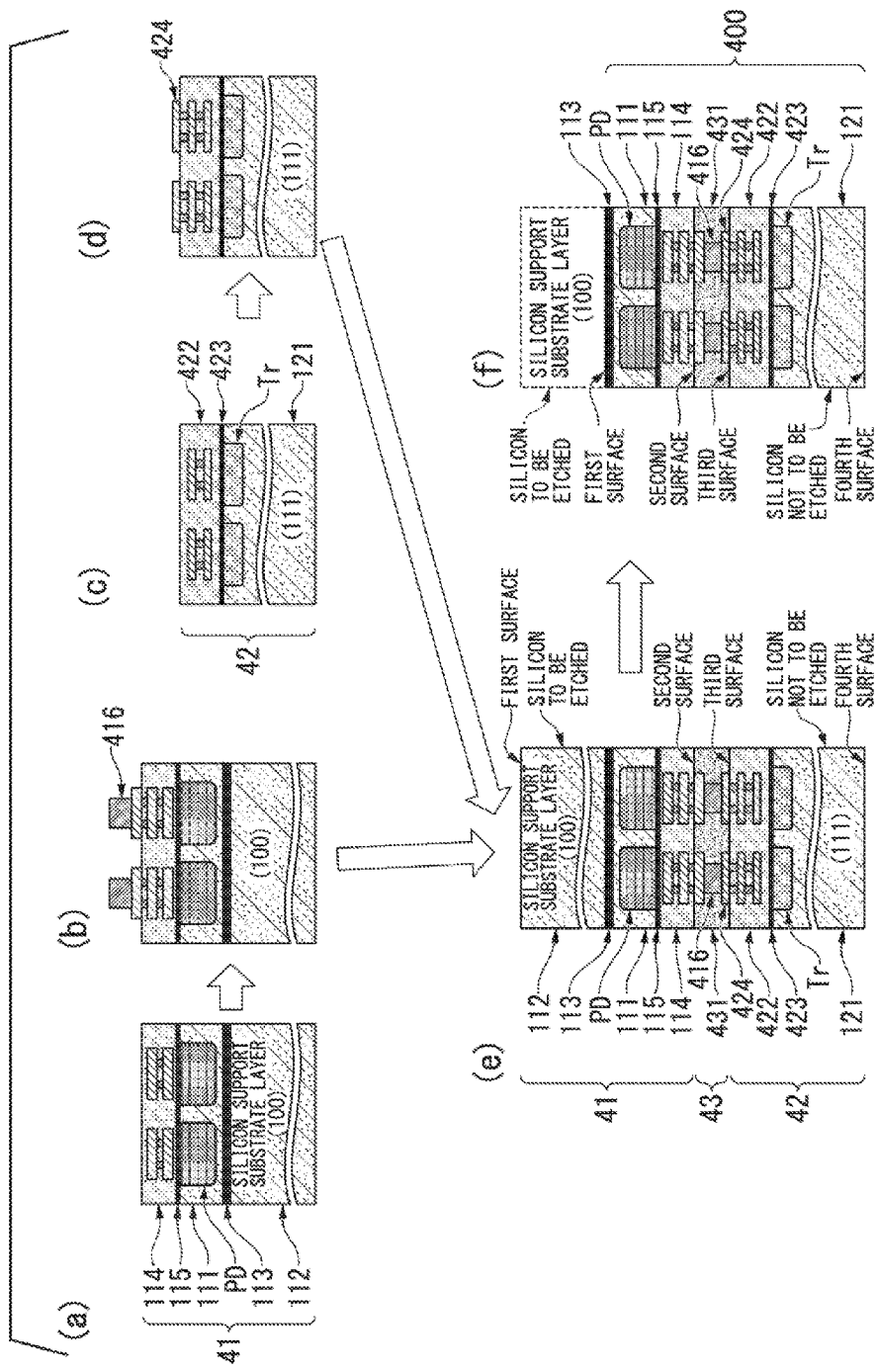
FIG. 4 is a cross-sectional view schematically showing a structure of a semiconductor device according to a fourth embodiment of the present invention.

A semiconductor device according to a fourth embodiment will be described below. Similarly to the solid-state imaging device 300 according to the third embodiment, the semiconductor device according to the fourth embodiment has a configuration of a backside illumination solid-state imaging device in which a pixel unit in which a plurality of pixels each having a photoelectric conversion unit such as a photo diode are arranged in a two-dimensional matrix is formed in a first silicon substrate. In the semiconductor device according to the fourth embodiment, circuit elements for realizing functions (operations) of the semiconductor device according to the fourth embodiment are also formed in the second silicon substrate. FIG. 4 is a cross-sectional view schematically showing a structure of the semiconductor device (the backside illumination solid-state imaging device) according to the fourth embodiment. Similarly to the semiconductor device according to the first embodiment shown in FIG. 1 or the solid-state imaging device 300 according to the third embodiment shown in FIG. 3, the semiconductor device 400 (hereinafter referred to as a "solid-state imaging device 400") according to the fourth embodiment has a configuration in which two silicon substrates (a first silicon substrate 41 and a second silicon substrate 42) are stacked. Similarly to the semiconductor device 100 according to the first embodiment or the solid-state imaging device 300 according to the third embodiment, a plurality of solid-state imaging devices 400 according to the fourth embodiment are formed in a wafer substrate, but one solid-state imaging device 300 is assumed to be manufactured for the purpose of easing explanation of FIG. 4.

The configuration of the solid-state imaging device 400 according to the fourth embodiment includes the same configuration as the semiconductor device 100 according to the first embodiment or the solid-state imaging device 300 according to the third embodiment. Accordingly, in the following description, the same elements in the solid-state imaging device 400 according to the fourth embodiment as the elements of the semiconductor device 100 according to the first embodiment or the elements of the solid-state imaging device 300 according to the third embodiment will be referenced and described by the same reference numerals as in the semiconductor device 100 according to the first embodiment or the solid-state imaging device 300 according to the third embodiment and detailed description of the same elements as in the semiconductor device 100 according to the first embodiment or the solid-state imaging device 300 according to the third embodiment will not be repeated.

(a) and (b) of FIG. 4 shows a structure of a first silicon substrate 41, (c) and (d) of FIG. 4 shows a structure of a second silicon substrate 42, (e) of FIG. 4 shows a state in which the first silicon substrate 41 and the second silicon substrate 42 are stacked, and (f) of FIG. 4 shows a final structure of the solid-state imaging device 400. Similarly to FIG. 3, FIG. 4 schematically shows a method of manufacturing the solid-state imaging device 400 (a manufacturing process) in (a) to (f) of FIG. 4.

Similarly to the solid-state imaging device 300 according to the third embodiment, the first silicon substrate 41 is a silicon substrate on which circuit elements for realizing functions (operations) of the solid-state imaging device 400 are formed in a wafer substrate having an SOI structure. The silicon layers in the first silicon substrate 41, that is, the device layer 111 and the silicon support substrate layer 112, have a crystal surface orientation of (100), similarly to the solid-state imaging device 300 according to the third embodiment.

On the device layer 111 side on the first silicon substrate 41, photo diodes PD, transistors, wires, and the like are formed as the circuit elements for realizing functions (operations) of the solid-state imaging device 400, similarly to the solid-state imaging device 300 according to the third embodiment. (a) of FIG. 4 schematically shows diffusion layers formed in the device layer 111 to form the photo diodes PD, multi-layered wires in the wiring layer 114 formed on the first silicon substrate 41, and an oxide film 115 which is appropriately formed.

In the solid-state imaging device 400, circuit elements for realizing the functions (operations) of the solid-state imaging device 400 are also formed in the second silicon substrate 42 which is stacked on the first silicon substrate 41. Accordingly, connection portions for electrical connection to the second silicon substrate 42 are formed on the first silicon substrate 41. In (b) of FIG. 4, connection electrodes 416 formed on the wiring layer 114 to electrically connect the corresponding circuit elements in the first silicon substrate 41 and the second silicon substrate 42 are shown. The connection electrodes 416 are, for example, micro bumps which are formed using a deposition method or a plating method.

Similarly to the solid-state imaging device 300 according to the third embodiment, the second silicon substrate 42 is a single-crystal silicon substrate that holds (supports) the thinned first silicon substrate 41. The crystal surface orientation of the silicon layer 121 of the second silicon substrate 42 is (111).

Here, in the solid-state imaging device 400, the circuit elements for realizing the functions (operations) of the solid-state imaging device 400 are also formed in the second silicon substrate 42. The circuit elements formed on the second silicon substrate 42 include, for example, a processing circuit that performs predetermined processes on pixel signals based on the charge signals corresponding to incident light generated by the photo diodes PD formed on the first silicon substrate 41. Accordingly on one side of the second silicon substrate 42, transistors Tr, wires, or the like including diffusion layers or single-layered or multiple-layered wires are formed as the circuit elements for realizing the functions (operations) of the solid-state imaging device 400. (c) of FIG. 4 schematically shows diffusion layers formed in the silicon layer 121 to form the transistors Tr and multi-layered wires in the wiring layer 422 formed on the second silicon substrate 42 to form the transistors Tr. In the structure of the second silicon substrate 42 shown in (c) of FIG. 4, an oxide film 423 which is appropriately formed by heat treatment or the like at the time of forming the wiring layer 422 also appears.

In the solid-state imaging device 400, since the circuit elements formed on the second silicon substrate 42 are electrically connected to the circuit elements formed on the first silicon substrate 41, connection portions for electrical connection to the first silicon substrate 41 are also formed on the second silicon substrate 42. (d) of FIG. 4 shows connection pads 424 formed on the wiring layer 422 to electrically connect the corresponding circuit elements in the first silicon substrate 41 and the second silicon substrate 42. The connection pads 424 correspond to the connection electrodes 416 formed on the wiring layer 114 of the first silicon substrate 41, respectively.

In the solid-state imaging device 400, similarly to the solid-state imaging device 300 according to the third embodiment, the first silicon substrate 41 and the second silicon substrate 42 are stacked. At this time, in the solid-state imaging device 400, as shown in (e) of FIG. 4, the silicon support substrate layer 112 side of the first silicon substrate 41 is defined as a first surface, and the device layer side on which the connection electrodes 416 are formed in the first silicon substrate 41 is defined as a second surface. One surface of the second silicon substrate 42 on which the circuit elements electrically connected to the circuit elements formed on the first silicon substrate 41 are formed is defined as a third surface and the other surface thereof on which no circuit element is formed is defined as a fourth surface. Similarly to the solid-state imaging device 300 according to the third embodiment, the second surface of the first silicon substrate 41 and the third surface of the second silicon substrate 42 are made to face each other. A connection electrode layer 431 that connects the connection electrodes 416 formed on the first silicon substrate 41 and the connection pads 424 formed on the second silicon substrate 42 is formed in the adhesive layer 43. Accordingly, the circuit elements formed on the first silicon substrate 41 and the circuit elements formed on the second silicon substrate 42 are electrically connected, and the connected circuit elements formed on the silicon substrates transmit and receive signals via the connection electrode layer 431.

As the connection electrode layer 431, a space which is present between the first silicon substrate 41 and the second silicon substrate 42 may be filled with an insulating member such as a resin adhesive.

Similarly to the solid-state imaging device 300 according to the third embodiment, by immersing the first silicon substrate 41 and the second silicon substrate 42 in the TMAH solution in the stacked (bonded) state, silicon with a predetermined thickness of the first silicon substrate 41 is etched. Accordingly, as shown in (d) of FIG. 4, the solid-state imaging device 400 having the final structure in which the silicon support substrate layer 112 in the first silicon substrate 41 is etched to thin the first silicon substrate 41 and the first surface is a surface 1A is manufactured.

At this time, in the solid-state imaging device 400, similarly to the solid-state imaging device 300 according to the third embodiment, since the crystal surface orientation of the silicon support substrate layer 112 of the first silicon substrate 41 and the crystal surface orientation of the second silicon substrate 42 are different from each other, the silicon support substrate layer 112 of the first surface is more etched than the second silicon substrate 42 and the second silicon substrate 42 is not substantially etched even when the etching processes. Accordingly, in the state in which the silicon substrates are stacked as shown in (c) of FIG. 4, the silicon support substrate layer 112 is sequentially etched from the first surface to the second surface. Accordingly, as shown in (d) of FIG. 4, the solid-state imaging device 400 having a structure in which the silicon support substrate layer 112 in the first silicon substrate 41 is etched to the BOX layer 113 can be manufactured.

According to the fourth embodiment, the semiconductor device (the solid-state imaging device 400) including a processing circuit that is formed on the third surface side of the second silicon substrate (the second silicon substrate 42), the processing circuit having circuit elements for performing predetermined processes on pixel signals based on the charge signals generated from the photoelectric conversion units (the photo diodes PD) of the pixels in the pixel unit (the pixel unit formed on the second surface side of the first silicon substrate 41) is configured.

According to the fourth embodiment, the solid-state imaging device 400 including connection portions (the connection electrodes 416 and the connection pads 424) that are formed on the second surface side of the first silicon substrate (the first silicon substrate 41) and the third surface side of the second silicon substrate 42 and that connect the circuit elements in the pixel unit (the pixel unit formed on the second surface side of the first silicon substrate 41) and the corresponding circuit elements in the processing circuit (the processing circuit formed on the third surface side of the second silicon substrate 42) is configured.

According to the fourth embodiment, the method of manufacturing the solid-state imaging device 400 including a fifth step of forming a processing circuit that includes circuit elements for performing predetermined processes on pixel signals based on the charge signals generated from the photoelectric conversion units (the photo diodes PD) of the pixels in the pixel unit (the pixel unit formed on the second surface side of the first silicon substrate 41) on the third surface side of the second silicon substrate 42 before the first step is configured.

According to the fourth embodiment, the method of manufacturing the solid-state imaging device 400 including a sixth step of forming the connection electrodes 416 and the connection pads 424 that connect the circuit elements in the pixel unit (the pixel unit formed on the second surface side of the first silicon substrate 41) and the corresponding circuit elements in the processing circuit (the processing circuit formed on the third surface side of the second silicon substrate 42) on the second surface side of the first silicon substrate 41 and the third surface side of the second silicon substrate 42 after the fourth step and the fifth step and before the first step is configured.

As described above, in the solid-state imaging device 400 according to the fourth embodiment, similarly to the solid-state imaging device 300 according to the third embodiment, the crystal surface orientation of the silicon support substrate layer 112 to be removed by etching in the first silicon substrate 41 and the crystal surface orientation of the second silicon substrate 42 which should not be removed by etching are set to be different from each other. In the solid-state imaging device 400 according to the fourth embodiment, the circuit elements for realizing the functions (operations) of the solid-state imaging device 400 are also formed on the second silicon substrate 42 and the connection portions are formed to electrically connect the circuit elements formed on the silicon substrates. Similarly to the solid-state imaging device 300 according to the third embodiment, after the first silicon substrate 41 and the second silicon substrate 42 are stacked, silicon with a predetermined thickness of the first silicon substrate 41 is wet-etched using the alkaline etching solution capable of performing anisotropic etching. Accordingly, in the solid-state imaging device 400 according to the fourth embodiment, only a silicon layer of a desired surface, that is, the silicon support substrate layer 112 to be removed, can be etched using the wet etching method. In the solid-state imaging device 400 according to the fourth embodiment, the same advantageous effects as in the solid-state imaging device 300 according to the third embodiment can be obtained.

In the solid-state imaging device 400 according to the fourth embodiment shown in FIG. 4, the connection electrodes 416 such as micro bumps are formed on the first silicon substrate 41 and the connection pads 424 are formed on the second silicon substrate 42 for the purpose of electrical connection of the circuit elements formed on the silicon substrates. However, the configuration for electrically connecting the circuit elements formed on the silicon substrates is not limited to the configuration shown in FIG. 4. For example, a configuration in which connection pads are formed on the first silicon substrate and the micro bumps are formed on the second silicon substrate may be employed. For example, a configuration in which micro bumps are formed on both the first silicon substrate and the second silicon substrate and the corresponding micro bumps are connected may be employed. For example, a configuration in which connection pads are formed on both the first silicon substrate and the second silicon substrate and the connection pads are connected to each other may be employed. At this time, when the connection pads are formed on the wiring layer as shown in (d) of FIG. 4, a space which is present between the first silicon substrate and the second silicon substrate of which the connection pads are connected may be filled with an insulating material member such as a resin adhesive. When the connection pads are formed on the same surfaces as the wiring layer in the silicon substrates, the silicon substrates may be bonded by oxide film bonding of the oxide films of the wiring layers on which the connection pads are formed.

In the solid-state imaging device 400 according to the fourth embodiment shown in FIG. 4, similarly to the semiconductor device 200 according to the second embodiment shown in FIG. 2, the fourth surface of the second silicon substrate 42 also serving to hold (support) the first silicon substrate 41 may be protected from etching by an oxide film.

As described above, according to the above-mentioned embodiments of the present invention, when a semiconductor device of which one silicon substrate is thinned is manufactured by stacking a plurality of silicon substrates and etching silicon of a desired surface using a wet etching method, the crystal surface orientation of the silicon layer to be removed by etching and the crystal surface orientation of the silicon layer which should not be removed by etching are set to be different from each other. More specifically, the crystal surface orientation of the silicon layer to be etched is set to a crystal surface orientation (the crystal surface orientation (100) in the embodiments) having high selectivity of an alkaline etching solution (the TMAH solution in the embodiments) and the crystal surface orientation of the silicon layer not to be etched is set to a crystal surface orientation (the crystal surface orientation (111)) having low selectivity of the alkaline etching solution. Accordingly, in the embodiments of the present invention, when the silicon substrates are immersed in the etching solution in the stacked (bonded) state, that is, when the silicon layer to be etched and the silicon layer not to be etched are simultaneously exposed to the etching solution, the silicon layer to be etched can be etched and the silicon layer not to be etched cannot be etched, depending on the selection ratio of the alkaline etching solution. Accordingly, in the above-mentioned embodiments of the present invention, it is not necessary to consider a defect or a scratch of the surface of the oxide film formed on a silicon layer to be protected from etching, which has been considered in manufacturing a conventional semiconductor device.

In the above-mentioned embodiments of the present invention, the alkaline etching solution which is used in the wet etching method is the TMAH solution. However, the etching solution which is used for etching is not limited to the etching solution which has been described above in the above-mentioned embodiments of the present invention. Examples of the alkaline etching solution capable of performing anisotropic etching such as the TMAH solution include nitrohydrofluoric acid and potassium hydroxide (chemical formula=KOH). For example, the potassium hydroxide (KOH) has a lower selection ratio to an oxide film than the TMAH solution, but the selection ratio of potassium hydroxide (KOH) to the oxide film is substantially silicon: oxide film=100:1, which exhibits a sufficiently large difference in selectivity. In this way, when an etching solution having a large difference in selectivity to the oxide film is used as the alkaline etching solution in the wet etching method, the same advantageous effects as in the above-mentioned embodiments of the present invention can be obtained.

In the above-mentioned embodiments of the present invention, the crystal surface orientation of the silicon layer to be etched (the silicon support substrate layer 112 in the first silicon substrate in the embodiments) is set to (100) and the crystal surface orientation of the silicon layer not to be etched (the silicon layer 121 in the second silicon substrate in the embodiments) is set to (111). That is, the crystal surface orientation of the first surface to be removed by etching is set to (100) and the crystal surface orientation of the fourth surface not to be removed by etching is set to (111). However, the crystal surface orientations of the silicon layers are not limited to the crystal surface orientations described in the above-mentioned embodiments of the present invention. That is, as long as it is a combination of crystal surface orientations having a sufficient difference in etching rate for the crystal surface orientations in an alkaline etching solution, a combination of crystal surface orientations of the silicon layers is not limited to the combination of crystal surface orientations described in the above-mentioned embodiments of the present invention. For example, the etching rate for the crystal surface orientation (110) and the crystal surface orientation (111) in the TMAH solution is (110):(111)=28:1, which exhibits a large difference. Accordingly, even when a combination of crystal surface orientations in which the crystal surface orientation of the silicon layer to be etched (the crystal surface orientation of the first surface to be removed by etching in the embodiments) is (110) and the crystal surface orientation of the silicon layer not to be etched (the crystal surface orientation of the fourth surface not to be removed by etching in the embodiments) is (111) is used, the same advantageous effects as in the above-mentioned embodiments of the present invention can be obtained.

In the above-mentioned embodiments of the present invention, for example, the crystal surface orientation of the device layer 111 and the silicon support substrate layer 112 of the first silicon substrate 11 is (100). However, in the present invention, the crystal surface orientation of the silicon support substrate layer 112 which is a silicon layer to be etched can be (100) or (110). Accordingly, the crystal surface orientation of the device layer 111 of the first silicon substrate 11 may not be the same as the crystal surface orientation of the silicon support substrate layer 112 to be etched.

In the above-mentioned embodiments of the present invention, for example, the first silicon substrate 41 has an SOI structure including the device layer 111, the BOX layer 113, and the silicon support substrate layer 112. In this configuration, the same state as if the etching stopped at the BOX layer 113 is obtained due to the selectivity of the alkaline etching solution to the oxide film and the circuit elements such as the photo diodes PD formed on the device layer 111 side of the first silicon substrate 41 can be protected from the etching. However, the configuration for protecting the circuit elements formed on a silicon substrate before being stacked from the etching is not limited to the configuration described above in the above-mentioned embodiments of the present invention. For example, the alkaline etching solution has a low speed at which the etching progresses (a low etching rate) even in an impurity layer which is formed by injecting P+ impurities into the silicon substrate and diffusing the impurities. Accordingly, in the silicon substrate not including the BOX layer, before a diffusion step of forming a P-well or an N-well which is performed in the step of forming transistors, the same state as if the etching stopped at the interface of the impurity layer can be obtained by forming the impurity layer which is diffused to a deeper region than the wells so as to have an interface at a position closer to the surface to be removed by the etching than the wells. Accordingly, it is possible to manufacture the same semiconductor devices as in the above-mentioned embodiments of the present invention. In this way, the idea of the present invention can be similarly applied to a configuration other than the configuration described in the above-mentioned embodiments of the present invention.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims

What is claimed is:

1. A semiconductor device having a stacked structure formed by stacking a first silicon substrate that is thinned and a second silicon substrate that supports the first silicon substrate,
    wherein the first silicon substrate includes a first surface with a crystal surface orientation of (100) or (110) and a second surface opposite to the first surface,
    wherein the second silicon substrate includes a third surface and a fourth surface that is opposite to the third surface and from which a silicon surface with a crystal surface orientation (111) is exposed, and
    wherein the semiconductor device is formed by etching silicon with a predetermined thickness in a direction from the first surface toward the second surface to make the first silicon substrate to be thinned, after bonding the first silicon substrate and the second silicon substrate in a state where the second surface and the third surface facing the second surface are bonded with each other.

2. The semiconductor device according to claim 1, further comprising a pixel unit in which a plurality of pixels are arranged in a two-dimensional matrix, wherein the plurality of pixels are formed at the second surface side of the first silicon substrate, and each of the plurality of pixels has a photoelectric conversion unit that generates a charge signal corresponding to an incident light.

3. The semiconductor device according to claim 2, further comprising a processing circuit that is formed at the third surface side of the second silicon substrate and includes circuit elements used for performing predetermined processes to pixel signals based on the charge signals generated by the photoelectric conversion units of the pixels in the pixel unit.

4. The semiconductor device according to claim 3, further comprising connection portions that are formed at the second surface side of the first silicon substrate and the third surface side of the second silicon substrate, wherein the connection portions are formed to connect circuit elements in the pixel unit and the corresponding circuit elements in the processing circuit.

5. The semiconductor device according to claim 1, wherein an adhesive layer is formed between the second surface of the first silicon substrate and the third surface of the second silicon substrate facing the second surface, and the adhesive layer is formed to bond the second surface of the first silicon substrate and the third surface of the second silicon substrate.

* * * * *